(12) United States Patent
Liu

(10) Patent No.: US 11,990,433 B2
(45) Date of Patent: May 21, 2024

(54) BOND PAD STRUCTURE COUPLED TO MULTIPLE INTERCONNECT CONDUCTIVE\ STRUCTURES THROUGH TRENCH IN SUBSTRATE

(71) Applicant: Taiwan Semiconductor Manufacturing Co., Ltd., Hsinchu (TW)

(72) Inventor: Ming Chyi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 228 days.

(21) Appl. No.: 17/366,556

(22) Filed: Jul. 2, 2021

(65) Prior Publication Data
US 2022/0344291 A1   Oct. 27, 2022

Related U.S. Application Data

(60) Provisional application No. 63/178,064, filed on Apr. 22, 2021.

(51) Int. Cl.
*H01L 23/498* (2006.01)
*H01L 23/00* (2006.01)
*H01L 25/065* (2023.01)

(52) U.S. Cl.
CPC ........ *H01L 24/05* (2013.01); *H01L 23/49822* (2013.01); *H01L 23/49844* (2013.01); *H01L 24/03* (2013.01); *H01L 25/0657* (2013.01); *H01L 2224/03001* (2013.01);
(Continued)

(58) Field of Classification Search
CPC ............ H01L 23/498; H01L 23/49844; H01L 23/49822; H01L 24/05
See application file for complete search history.

(56) References Cited

U.S. PATENT DOCUMENTS 9,502,343 B1 * 11/2016 Hsieh ................ H01L 23/49838
11,189,538 B2 * 11/2021 Huang .................... H01L 24/03
2007/0023920 A1   2/2007 Jao et al.
(Continued)

FOREIGN PATENT DOCUMENTS

TW         201005903 A      2/2010

OTHER PUBLICATIONS

Beinglass et al. "CVD AlrPVD Al integration for advanced via and interconnect technology" Thin Solid Films 320 (1998), 35-44, published on May 4, 1998.

*Primary Examiner* — Dale E Page
*Assistant Examiner* — Ilner Jean Baptiste
(74) *Attorney, Agent, or Firm* — Eschweiler & Potashnik, LLC

(57) ABSTRACT

In some embodiments, the present disclosure relates to a device that includes an interconnect structure arranged on a frontside of a substrate. The interconnect structure includes interconnect conductive structures embedded within interconnect dielectric layers. A trench extends completely through the substrate to expose multiples ones of the interconnect conductive structures. A bond pad structure is arranged on a backside of the substrate and extends through the trench of the substrate to contact the multiple ones of the interconnect conductive structures. A bonding structure is arranged on the backside of the substrate and electrically contacts the bond pad structure.

20 Claims, 13 Drawing Sheets

(52) U.S. Cl.
CPC .................. *H01L 2224/033* (2013.01); *H01L 2224/05556* (2013.01); *H01L 2224/05573* (2013.01)

(56) References Cited

U.S. PATENT DOCUMENTS

| | | |
|---|---|---|
| 2012/0228765 A1 | 9/2012 | Alvarado et al. |
| 2019/0304876 A1 | 10/2019 | Foo et al. |
| 2020/0381347 A1 | 12/2020 | Pu et al. |
| 2021/0225729 A1* | 7/2021 | Bozorg-Grayeli ......................... H01L 21/4853 |

* cited by examiner

BOND PAD STRUCTURE COUPLED TO MULTIPLE INTERCONNECT CONDUCTIVE\ STRUCTURES THROUGH TRENCH IN SUBSTRATE

REFERENCE TO RELATED APPLICATION

This application claims the benefit of U.S. Provisional Application No. 63/178,064, filed on Apr. 22, 2021, the contents of which are hereby incorporated by reference in their entirety.

BACKGROUND

The semiconductor industry continues to improve the integration density of various electronic components (e.g., transistors, diodes, resistors, capacitors, etc.) by, for example, reducing minimum feature sizes, which allows more components to be integrated into a given area. Smaller package structures, that utilize less area or smaller heights, are developed to package the semiconductor devices. For example, to further increase circuit density per area, three-dimensional (3D) integrated circuits (ICs) have been investigated.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
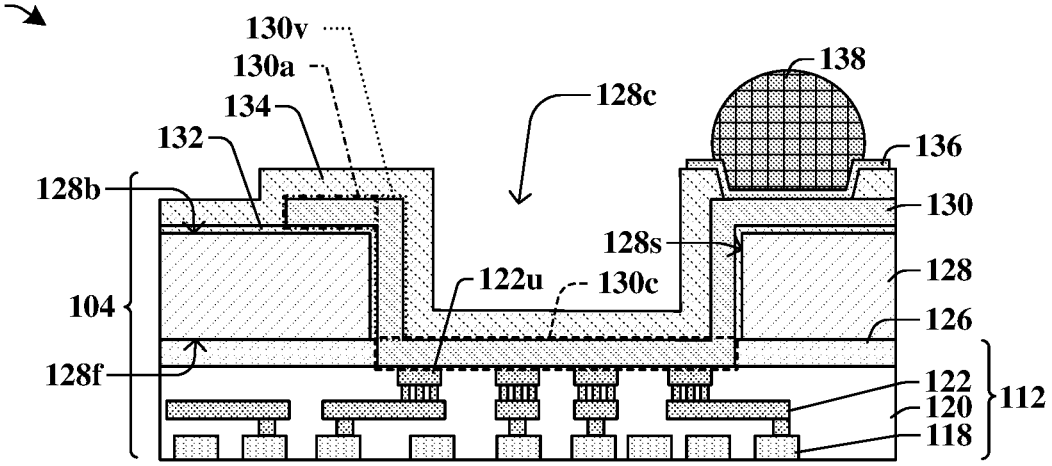
FIG. 1A illustrates a cross-sectional view of some embodiments of an integrated chip comprising a bond pad structure extending through a substrate from a backside of the substrate to a frontside of the substrate, wherein the bond pad structure contacts multiple interconnect conductive structures arranged on the frontside of the substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Three-dimensional (3D) integrated circuits (IC) comprise multiple substrates and devices bonded to one another in the vertical direction to increase the device density (e.g., number of devices per surface area of a substrate or circuit board). In some instances, a first 3D IC is electrically coupled to a second 3D IC using wires, solder bumps, and/or other conductive structures between bond pad layers of the first 3D IC and of the second 3D IC.

In some instances, the first 3D IC may comprise a bond pad layer arranged on a backside of a substrate, wherein devices and/or interconnect structures that are coupled to the bond pad layer are arranged on a frontside of the substrate. The bond pad layer is exposed such that the aforementioned wires, solder bumps, and/or other conductive structures can be coupled to the bond pad layer during a bonding process. One or more backside through-substrate-vias (BTSV) may extend completely through the substrate to electrically couple the bond pad layer on the backside of the substrate to the devices and/or interconnect structures on the frontside of the substrate.

As devices arranged over the substrate are arranged closer together to increase the device density of the first 3D IC, the critical dimension of the BTSVs are reduced such that the BTSVs are also arranged closer together. The BTSVs are formed by patterning holes in the substrate, and then filling the holes with a conductive material. When a ratio of the depth of the holes to the critical dimension of the holes is large as the critical dimension of the BTSVs are reduced, filling the holes with the conductive material is a challenge. For example, the holes may not get completely filled with the conductive material, and/or voids may form within BTSVs as the holes are being filled with the conductive material, resulting in BTSVs that provide a poor connection between the bond pad layer and devices and/or interconnect structures.

Various embodiments of the present disclosure relate to a 3D IC comprising a bond pad structure that extends through a trench of a substrate from a backside of the substrate to a frontside of the substrate to directly contact an underlying interconnect structure. For example, in some embodiments, the substrate comprises a trench, wherein multiple interconnect contacts of the interconnect structure are arranged directly below the trench. The interconnect contacts are arranged on the frontside of the substrate. In some embodiments, the bond pad structure extends across and directly contacts the multiple interconnect contacts. The trench has a large critical dimension, which advantageously increases the ease of forming layers/structures within the trench. Therefore, in some such embodiments, the trench of the substrate and the continuous bond pad structure coupled to multiple interconnect contacts eliminates the need for BTSVs, thereby increasing the reliability of the electrical connection between the bond pad structure and interconnect structure.

FIG. 1A illustrates a cross-sectional view 100A of some embodiments of an integrated chip comprising a bond pad structure extending completely through a substrate to contact multiple interconnect conductive structures.

The cross-sectional view 100A of FIG. 1A includes a first integrated circuit (IC) 104 comprising a substrate 128. An interconnect structure 112 is arranged on a frontside 128f of the substrate 128, and a bonding structure 138 is arranged on a backside 128b of the substrate 128. Thus, in FIG. 1A, the backside 128b of the substrate 128 is facing "up" such that the bonding structure 138 is arranged over the substrate 128 and the interconnect structure 112 is arranged below the substrate 128. In some embodiments, the bonding structure 138 comprises a solder bump, a wire, and/or some other suitable conductive feature. In some such embodiments, other integrated circuits and/or circuit boards are coupled to the first IC 104 through the bonding structure 138. In some embodiments, the bonding structure 138 is arranged on an under bump metallization (UBM) layer 136 that comprises a conductive material.

In some embodiments, the interconnect structure 112 comprises interconnect conductive structures 122 that includes a network of interconnect vias and interconnect wires configured to provide pathways for signals (e.g., current, voltage) to travel to and from other ICs (not shown) coupled to the first IC 104 of FIG. 1A. Further, in some embodiments, the interconnect structure 112 comprises bonding contacts 118 configured to bond to other ICs (not shown). The interconnect conductive structures 122 are embedded within an interconnect dielectric structure 120 that comprises multiple interconnect dielectric layers. In some embodiments, a first interconnect dielectric layer 126 of the interconnect structure 112 is arranged directly on the frontside 128f of the substrate 128.

The substrate 128 comprises a trench 128c that extends completely through the substrate 128 and is defined by inner sidewalls 128s of the substrate 128. Multiple upper interconnect conductive structures 122u are arranged directly below the trench 128c of the substrate 128. The first IC 104 further comprises a bond pad structure 130 that extends along the backside 128b of the substrate 128, through the trench 128c along the inner sidewalls 128s of the substrate 128, and along the multiple upper interconnect conductive structures 122u to electrically couple the interconnect structure 112 to the bonding structure 138 on the UBM layer 136.

In other words, the bond pad structure 130 comprises a backside horizontal portion 130a that extends along the backside 128b of the substrate 128; a vertical portion 130v that extends along the inner sidewalls 128s of the substrate 128; and a frontside horizontal portion 130c that extends along the multiple upper interconnect conductive structures 122u. The vertical portion 130v of the bond pad structure 130 connects the frontside horizontal portion 130c to the backside horizontal portion 130a of the bond pad structure 130.

In some embodiments, the frontside horizontal portion 130c of the bond pad structure 130 is arranged below the frontside 128f of the substrate 128 in FIG. 1A. In some embodiments, a first insulation layer 132 is arranged between the bond pad structure 130 and the substrate 128, and a second insulation layer 134 is arranged over the bond pad structure 130. In some embodiments, the bonding structure 138 and the UBM layer 136 extend through the second insulation layer 134 to contact the backside horizontal portion 130a of the bond pad structure 130. In some embodiments, the frontside horizontal portion 130c of the bond pad structure 130 extends through the first interconnect dielectric layer 126 to contact the multiple upper interconnect conductive structures 122u.

In some embodiments, the trench 128c has a larger width than its depth. Because the trench 128c of the substrate 128 is substantially wide (e.g., has a large critical dimension), the bond pad structure 130 is more reliably formed through the trench 128c to contact the multiple upper interconnect conductive structure 122u. Thus, even if the multiple upper interconnect conductive structures 122u are decreased in size and/or are arranged closer together to increase device density, the trench 128c of the substrate 128 will still remain substantially wide (e.g., has a large critical dimension), which mitigates defects and/or landing issues when forming the bond pad structure 130 over the multiple upper interconnect conductive structures 122u and ultimately increases the reliability of the overall first IC 104.

Figure 1B:
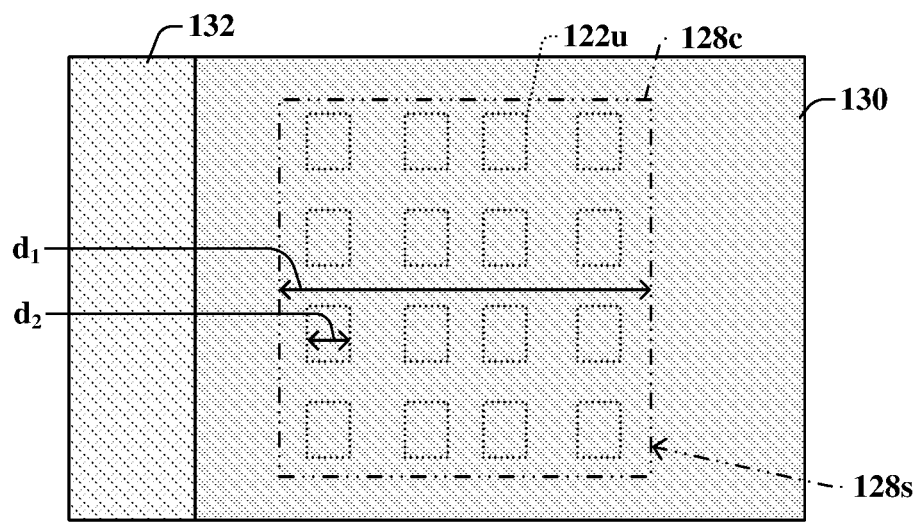
FIG. 1B illustrates a top-view of some embodiments corresponding to FIG. 1A.

FIG. 1B illustrates a top-view 100B of some embodiments of the bond pad structure 130 arranged over multiple upper interconnect conductive structures 122u. In some embodiments, the top-view 100B of FIG. 1B corresponds to a top-view of FIG. 1A without the presence of the second insulation layer 134, the UBM layer 136, or the bonding structure 138.

The trench 128c of the substrate (128 of FIG. 1A) is illustrated with a dot-hashed line in FIG. 1B because the bond pad structure 130 covers the trench 128c from the top-view 100B. In some embodiments, although the trench 128c extends through the substrate (128 of FIG. 1A) in the vertical direction, the trench 128c does not extend completely through the substrate (128 of FIG. 1A) in the horizontal directions. Thus, as shown in the top-view 100B of FIG. 1B, the inner sidewalls 128s of the substrate (128 of FIG. 1A) define all outer sidewalls of the trench 128c.

The multiple upper interconnect conductive structures 122u are illustrated with dotted lines in FIG. 1B because the bond pad structure 130 covers the multiple upper interconnect conductive structures 122u from the top-view 100B. In some embodiments, an array of multiple upper interconnect conductive structures 122u are arranged directly below the trench 128c and coupled to the same bond pad structure 130. It will be appreciated that in some other embodiments, the substrate (128 of FIG. 1A) may comprise multiple trenches 128c, wherein each trench directly overlies multiple upper interconnect conductive structures 122u. Further, it will be appreciated that more or less multiple upper interconnect conductive structures 122u than what is shown in FIG. 1B may be arranged below the trench 128c. Nevertheless, in some such embodiments, the trench 128c overlies more than one upper interconnect conductive structures 122u.

Further, in some embodiments, the trench 128c has a critical dimension (e.g., smallest dimension from the top-view) equal to a first distance $d_1$, and each multiple upper interconnect conductive structure 122u has a critical dimension (e.g., smallest dimension from the top-view) equal to a second distance $d_2$. In some embodiments, the first distance $d_1$ of the trench 128c is in a range of between, for example, approximately 10 micrometers and approximately 500 micrometers. In some embodiments, the second distance $d_2$ is in a range of between, for example, approximately 0.01 micrometers to approximately 10 micrometers. The first distance $d_1$ is greater than the second distance $d_2$ which allows for the bond pad structure 130 to be formed through the trench 128c and coupled to the multiple upper interconnect conductive structures 122u with fewer defects (e.g., voids due to small critical dimensions, offset landing on each multiple upper interconnect conductive structure 122u, etc.).

Figure 2:
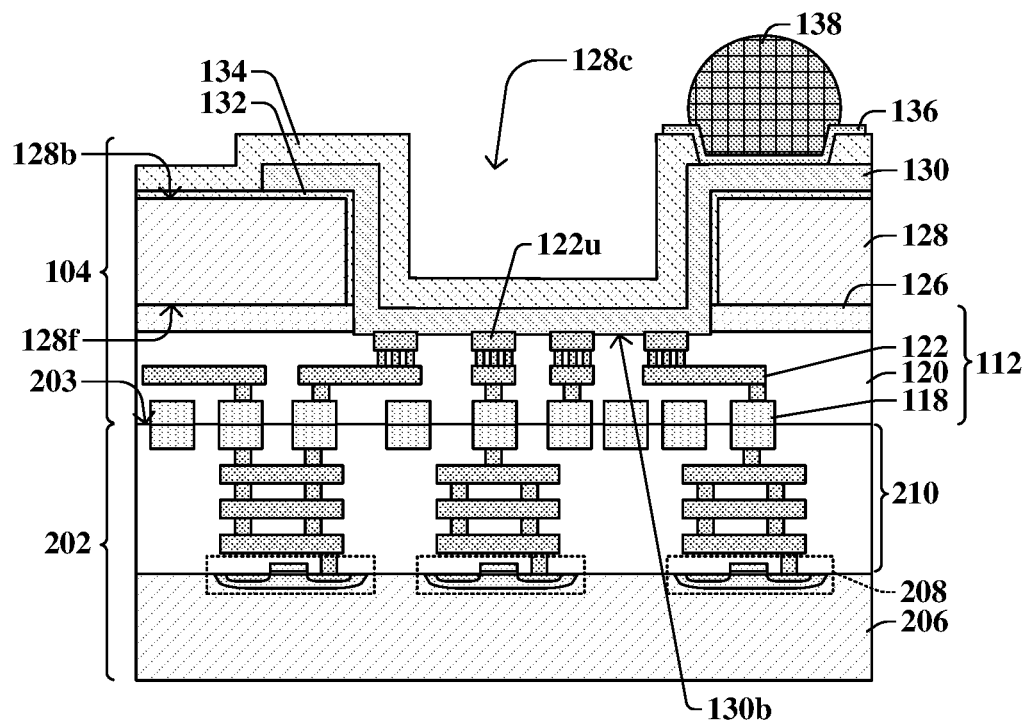
FIGS. 2 and 3 illustrate cross-sectional views of some other embodiments of a bond pad structure extending through a substrate to couple a bonding structure on a backside of the substrate to an interconnect structure on a frontside of the substrate.

FIG. 2 illustrates a cross-sectional view 200 of some other embodiments of a bond pad structure extending through a substrate to contact multiple upper interconnect conductive structures.

As shown in the cross-sectional view 200 of FIG. 2, in some embodiments a bottommost surface 130b of the bond pad structure 130 extends below topmost surfaces of the multiple upper interconnect conductive structures 122u. In some such embodiments, this effect may be due to over-etching of the interconnect dielectric structure 120. Thus, in some embodiments, the bond pad structure 130 extends through and at least partially below the first interconnect dielectric layer 126 to contact the multiple upper interconnect conductive structures 122u.

Further, in some embodiments, the first IC 104 is coupled to a second IC 202 at a bonding interface 203. In some such embodiments, the second IC 202 may comprise, for example, semiconductor devices 208 arranged over and/or within a lower substrate 206. In some embodiments, the semiconductor devices 208 may be or comprise a transistor (e.g., metal-oxide-semiconductor field effect transistor (MOSFET)), an optical device, a memory device, or some other suitable semiconductor device. In some embodiments, a lower interconnect structure 210 is arranged over the lower substrate 206 and also comprises interconnect conductive structures 122 arranged within an interconnect dielectric structure 120. In some embodiments, the interconnect conductive structures 122 of the lower interconnect structure 210 include a network of interconnect vias and interconnect wires coupled to the semiconductor devices 208 and configured to provide pathways for signals (e.g., current, voltage) to travel to and from the semiconductor devices 208. Further, in some embodiments, the lower interconnect structure 210 comprises bonding contacts 118 arranged in an upper portion of the lower interconnect structure 210 that are bonded to bonding contacts 118 of the first IC 104 along the bonding interface 203. Thus, through the bonding interface 203, the first IC 104 is electrically and structurally coupled to the second IC 202.

Figure 3:
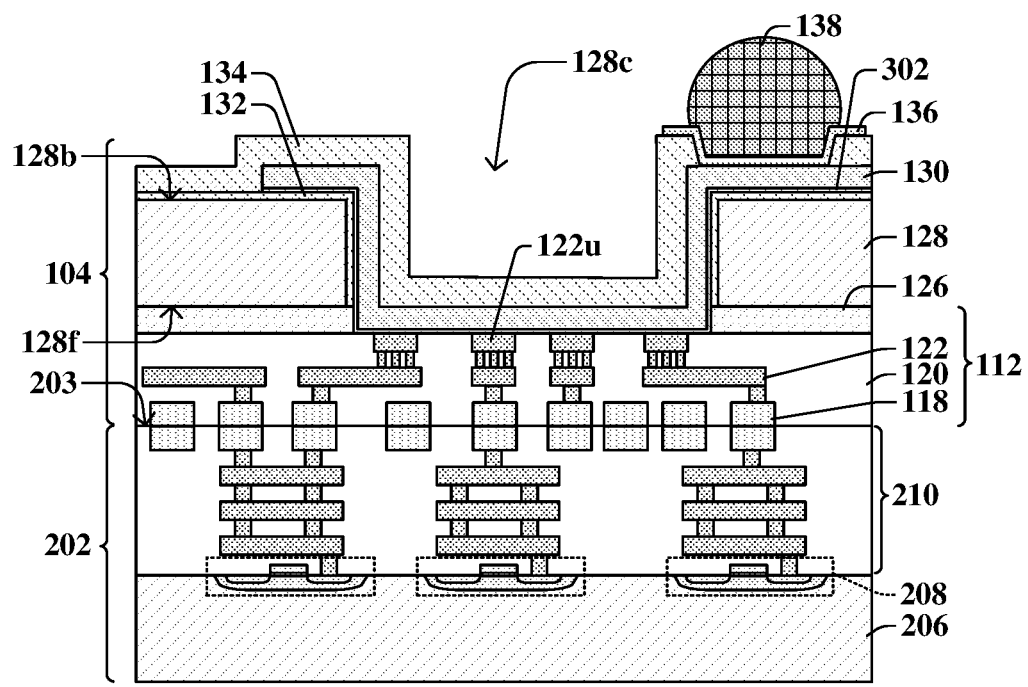

FIG. 3 illustrates a cross-sectional view 300 of yet some other embodiments of a bond pad structure extending through a substrate to contact multiple upper interconnect conductive structures.

As shown in the cross-sectional view 300 of FIG. 3, in some embodiments, a barrier layer 302 is arranged along a lower and outer surfaces of the bond pad structure 130. Thus, in some embodiments, the barrier layer 302 is arranged directly between the bond pad structure 130 and the multiple upper interconnect conductive structures 122u. In some embodiments, the barrier layer 302 is an adhesion layer to improve the structural integrity of the bond pad structure 130 or is a diffusion barrier layer to prevent the bond pad structure 130 from diffusing into other layers of the first IC 104 and creating cross-talk.

In some embodiments, the barrier layer 302 comprises, for example, titanium, tantalum, titanium nitride, tantalum nitride, or some other suitable material. In some embodiments, the barrier layer 302 has a thickness in a range of between, for example, approximately 10 angstroms to approximately 2,000 angstroms. In some embodiments, the bond pad structure 130 may comprise, for example, copper, aluminum, tungsten, or some other suitable conductive material. In some embodiments, the bond pad structure 130 has a thickness in a range of between, for example, approximately 0.3 micrometers to approximately 10 micrometers. Further, in some embodiments, the substrate 128 of the first IC 104 comprises, for example, silicon, germanium, a III/V element semiconductor material, or some other suitable semiconductor material.

Figure 4A:
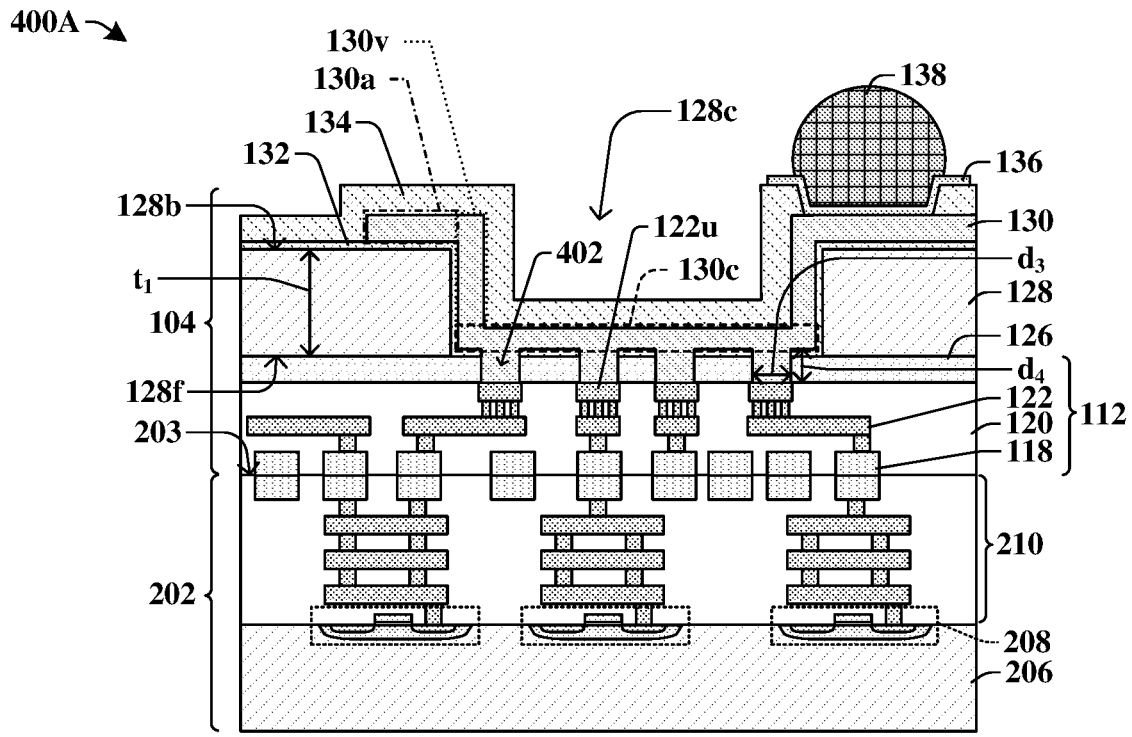
FIG. 4A illustrates a cross-sectional view of some embodiments of a bond pad structure extending through a substrate to couple a bonding structure on a backside of the substrate to an interconnect structure on a frontside of the substrate, wherein the bond pad structure comprises lower protrusion portions that extend below the substrate to contact the interconnect structure.

FIG. 4A illustrates a cross-sectional view 400A of some embodiments of an integrated chip comprising a bond pad structure extending completely through a substrate and comprising protrusion portions that each contact an upper interconnect conductive structure.

In some embodiments, the bond pad structure 130 further comprises lower protrusion portions 402 that extend toward the multiple upper interconnect conductive structures 122u from the frontside horizontal portion 130c of the bond pad structure 130 and through the first insulation layer 132 and the first interconnect dielectric layer 126 to contact the multiple upper interconnect conductive structures 122u. Thus, in some such embodiments, the frontside horizontal portion 130c of the bond pad structure 130 is arranged above the first insulation layer 132 and the first interconnect dielectric layer 126. In some embodiments, each lower protrusion portion 402 is spaced apart from one another in the lateral direction by the first insulation layer 132 and the first interconnect dielectric layer 126. In some embodiments, a ratio of a total number of the lower protrusion portions 402 to a total number of the multiple upper interconnect conductive structures 122u is 1:1. Thus, in some embodiments, each lower protrusion portion 402 contacts one upper interconnect conductive structure 122u.

In some embodiments, each lower protrusion portion 402 has a critical dimension or width equal to a third distance $d_3$ and a height equal to a fourth distance $d_4$. In some embodiments, the fourth distance $d_4$ is measured from a bottommost surface of the frontside horizontal portion 130c of the bond pad structure 130 and a bottommost surface of the lower protrusion portion 402. In some embodiments, the third distance $d_3$ and the fourth distance $d_4$ are each in a range of between, for example, approximately 0.01 micrometers and approximately 1 micrometer. In some embodiments, the aspect ratio of the lower protrusion portion 402, which is a ratio of the height (e.g., fourth distance $d_4$) to the critical dimension (e.g., third distance $d_3$) is less than or equal to approximately 1. When the aspect ratio of the lower protrusion portion 402 is greater than 1, then voids may form in the lower protrusion portions 402 because forming a metal in a hole with a large aspect ratio becomes difficult. When the aspect ratio of the lower protrusion portion 402 is less than or equal to 1, then the lower protrusion portions 402 may be formed more easily within holes of the first insulation layer 132 and the first interconnect dielectric layer 126, thereby avoiding defects (e.g., voids) in the lower protrusion portions 402.

Further, if the trench 128c of the substrate 128 were not present, then the lower protrusion portions 402 of the bond pad structure 130 would have to extend through an entire first thickness ti of the substrate 128 such that the height of the lower protrusion portions 402 would be equal to a sum of the first thickness ti and the fourth distance $d_4$ in order to contact each upper interconnect conductive structure 122u. In some embodiments, the first thickness ti of the substrate 128 is equal to a value in a range of between, for example, approximately 1 micrometer and approximately 10 micrometers. Thus, if each lower protrusion portion 402 had to extend through the thickness ti of the substrate 128, then the aspect ratio each lower protrusion portion 402 would be greater than 1, and defects would likely form within the lower protrusion portions 402 of the bond pad structure 130. Therefore, because of the trench 128c extending completely through the substrate 128 and arranged over multiple upper interconnect conductive structures 122u, the lower protrusion portions 402 of the bond pad structure 130 may have an aspect ratio less than or equal to 1, thereby mitigating defects to the bond pad structure 130 and improving the reliability of the overall device.

Figure 4B:
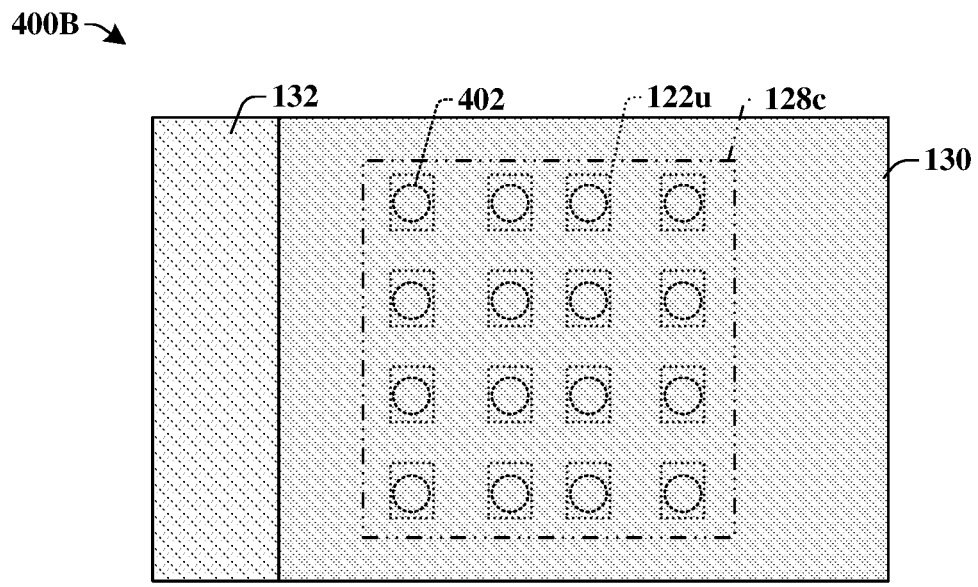
FIG. 4B illustrates a top-view of some embodiments corresponding to FIG. 4A.

FIG. 4B illustrates a top-view 400B of some embodiments of the bond pad structure 130 arranged over multiple upper interconnect conductive structures 122u. In some embodiments, the top-view 400B of FIG. 4B corresponds to a top-view of FIG. 4A without the presence of the second insulation layer 134, the UBM layer 136, or the bonding structure 138.

The lower protrusion portions 402 of the bond pad structure 130 are illustrated with short-hashed lines in FIG. 4B because it will be appreciated that the lower protrusion portions 402 would not be visible from the top-view 400B perspective. As illustrated in the top-view 400B of FIG. 4B, in some embodiments, the lower protrusion portions 402 have a circular top-view and the upper interconnect conductive structures 122u have a rectangular top-view. It will be appreciated that in other embodiments, the lower protrusion portions 402 and the upper interconnect conductive structures 122u have other top-view profiles than what is illustrated in FIG. 4B.

Figure 5:
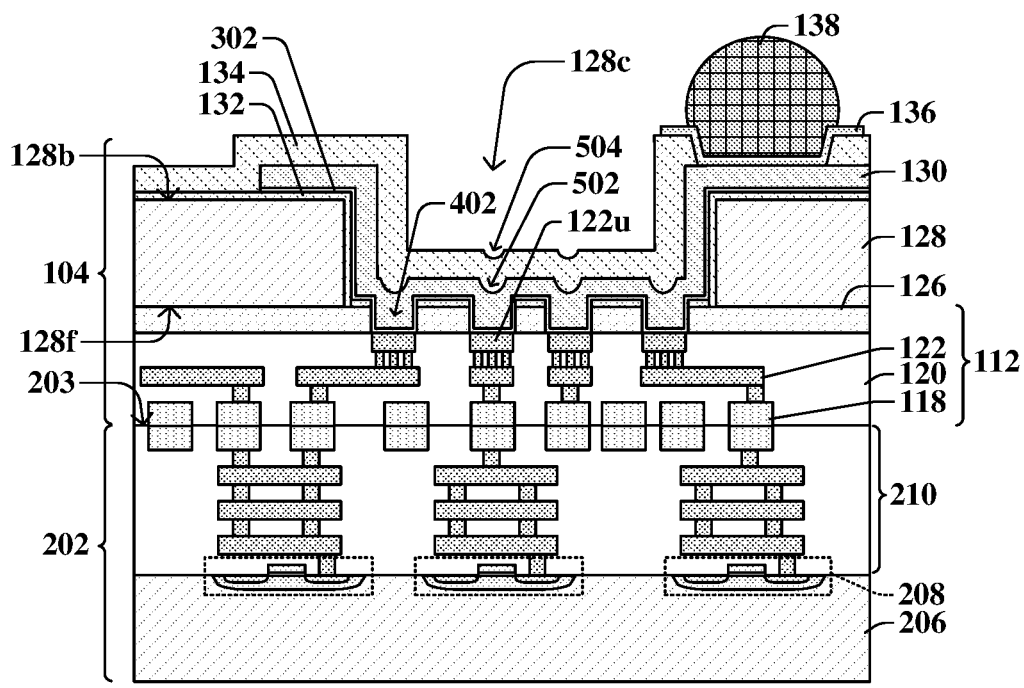
FIGS. 5 and 6 illustrate cross-sectional views of some other embodiments of a bond pad structure extending through a substrate to couple a bonding structure on a backside of the substrate to an interconnect structure on a frontside of the substrate and comprising lower protrusion portions.

FIG. 5 illustrates a cross-sectional view 500 of some other embodiments of a bond pad structure extending through a substrate and comprising lower protrusion portions that contact multiple upper interconnect conductive structures.

As shown in the cross-sectional view 500 of FIG. 5, in some embodiments, a barrier layer 302 is arranged along lower and outer surfaces of the bond pad structure 130. Thus, in some embodiments, the barrier layer 302 is arranged directly between the lower protrusion portions 402 of the bond pad structure 130 and the multiple upper interconnect conductive structures 122u. Further, in some embodiments, an upper surface of the frontside horizontal portion (130c of FIG. 4A) of the bond pad structure 130 comprises indents 502 arranged directly above the lower protrusion portions 402 of the bond pad structure 130 due to residual effects of forming a bond pad material over the first interconnect dielectric layer 126 and through the first interconnect dielectric layer 126. Thus, in some embodiments, the upper surface of the frontside horizontal portion (130c of FIG. 4A) of the bond pad structure 130 is not planar and does not have an equal thickness throughout its length. Similarly, because the second insulation layer 134 is arranged over the bond pad structure 130, in some embodiments, the second insulation layer 134 also comprises indents 504 arranged over the indents 502 of the bond pad structure 130 and thus, does not have a substantially planar upper surface.

Figure 6:
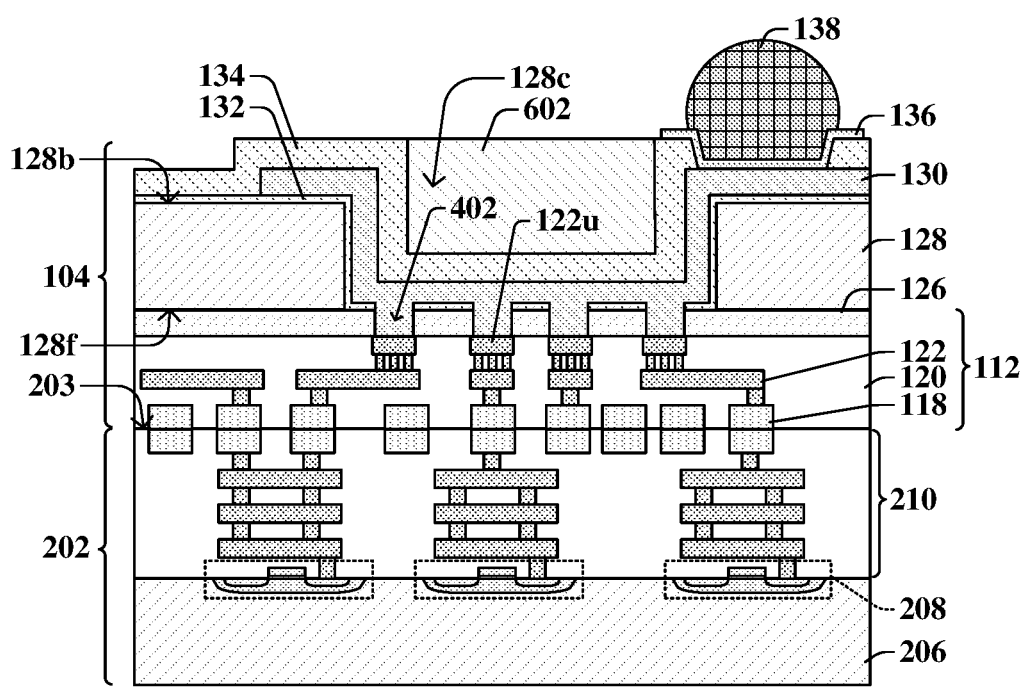

FIG. 6 illustrates a cross-sectional view 600 of yet some other embodiments of a bond pad structure extending through a substrate and comprising lower protrusion portions that contact multiple upper interconnect conductive structures.

As shown in the cross-sectional view 600 of FIG. 6, in some embodiments, a filler layer 602 is arranged within the trench 128c of the substrate 128 and is laterally surrounded by the second insulation layer 134. In some such embodiments, the filler layer 602 comprises a dielectric material and is configured to provide structural support to the first IC 104.

FIGS. 7-21 illustrate various views 700-2100 of some embodiments of a method of patterning a backside of a substrate and forming a bond pad structure over and completely through the backside of the substrate such that one bond pad contacts multiple interconnect conductive structures arranged on a frontside of the substrate. Although FIGS. 7-21 are described in relation to a method, it will be appreciated that the structures disclosed in FIGS. 7-21 are not limited to such a method, but instead may stand alone as structures independent of the method.

Figure 7:
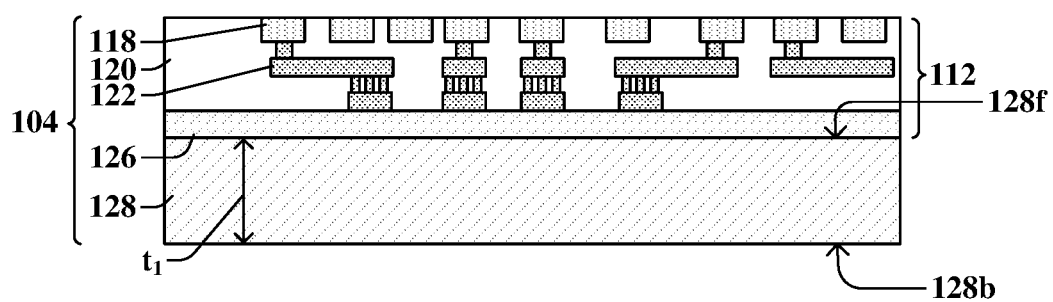
FIGS. 7-20 illustrate various views of some embodiments of a method of forming a bond pad structure that extends through a trench of a substrate to couple a bonding structure to multiple interconnect conductive structures, wherein the multiple interconnect conductive structures directly underlie the trench of the substrate.

As shown in cross-sectional view 700 of FIG. 7, a substrate 128 is provided. In some embodiments, the substrate 128 may comprise any type of semiconductor body (e.g., silicon/CMOS bulk, SiGe, silicon on insulator (SOI) substrate, etc.) such as a semiconductor wafer or one or more die on a wafer, as well as any other type of semiconductor and/or epitaxial layers formed thereon and/or otherwise associated therewith. In some embodiments, the substrate 128 may have a first thickness ti in a range of between, for example, approximately 1 micrometer and approximately 10 micrometers. On a frontside 128f of the substrate 128, an interconnect structure 112 is formed. In some embodiments, the interconnect structure 112 comprises interconnect conductive structures 122 (e.g., interconnect vias, interconnect wires) embedded within an interconnect dielectric structure 120. The interconnect dielectric structure 120 comprises multiple interconnect dielectric layers. For example, a first interconnect dielectric layer 126 is a bottommost layer of the interconnect structure 112 in FIG. 7 and is arranged directly on the frontside 128f of the substrate. Further, in some embodiments, bonding contacts 118 are arranged within the interconnect dielectric structure 120 at a top portion of the interconnect structure 112 in FIG. 7. At least the interconnect structure 112 arranged over the substrate 128 form a first integrated circuit (IC) 104.

In some embodiments, the interconnect conductive structures 122 comprise a conductive material such as, for example, copper, aluminum, tungsten, titanium, or some other suitable conductive material. In some embodiments, the bonding contacts 118 comprise a same material as the interconnect conductive structures 122 or comprise a different, yet still conductive material than the interconnect conductive structures 122. In some embodiments, the interconnect dielectric structure 120 comprises a dielectric material, such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the interconnect structure 112 is formed over the frontside 128f of the substrate 128 through various steps of deposition (e.g., physical vapor deposition (PVD), chemical vapor deposition (CVD), atomic layer deposition (ALD), sputtering, etc.), patterning (e.g., photolithography/etching), and removal processes (e.g., etching, chemical mechanical planarization (CMP), etc.).

Figure 8:
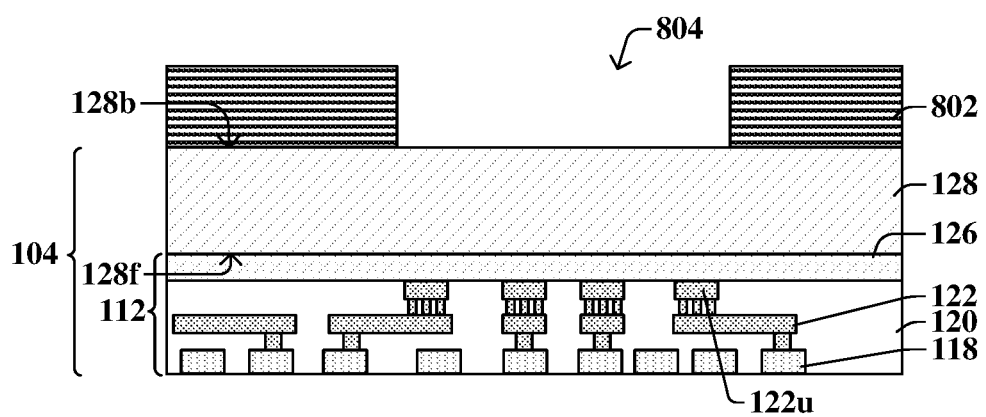

As shown in cross-sectional view 800 of FIG. 8, the substrate 128 is flipped over for patterning of a backside 128b of the substrate 128. A first masking structure 802 is formed on the backside 128b of the substrate 128. In some embodiments, the first masking structures 802 comprises a first opening 804 arranged directly over upper interconnect conductive structures 122u. The upper interconnect conductive structures 122u are the interconnect conductive structures 122 arranged closest to the frontside 128f of the substrate 128. In some embodiments, the first masking structure 802 is formed using photolithography and removal (e.g., etching) processes. In some embodiments, the first masking structure 802 comprises a photoresist material or a hard mask material.

As shown in cross-sectional view 900A of FIG. 9A, a first removal process 902 is performed to remove a portion of the substrate 128 arranged below the first opening (804 of FIG. 8) of the first masking structure 802. In some embodiments, the first removal process 902 comprises a dry etching process and/or a wet etching process. The first removal process 902 forms a trench 128c within the substrate 128 that extends completely through the substrate 128. The trench 128c is defined by inner sidewalls 128s of the substrate 128 and has a critical dimension equal to a first distance $d_1$. In some embodiments, the first distance $d_1$ is in a range of between, for example, approximately 10 micrometers and approximately 500 micrometers. Thus, in some embodiments, the trench 128c is wider than the first thickness (ti of FIG. 7) of the substrate 128. The trench 128c is arranged over more than one of the upper interconnect conductive structures 122u.

Figure 9A:
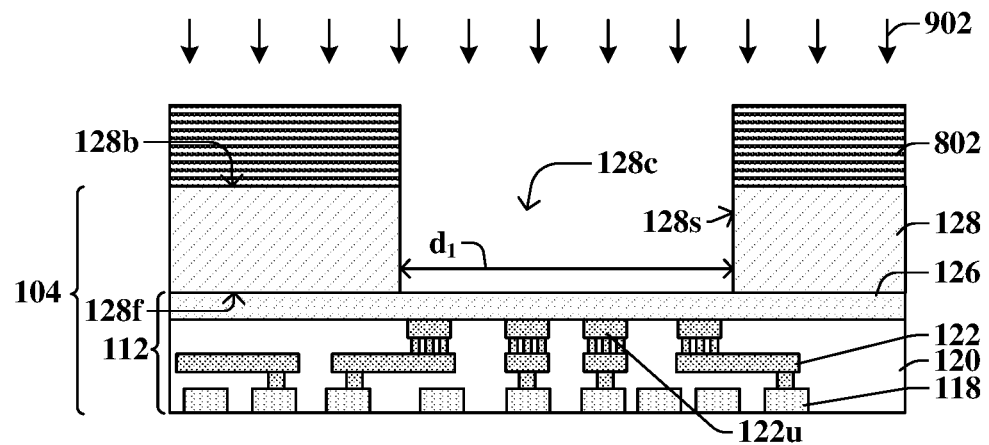
Figure 9B:
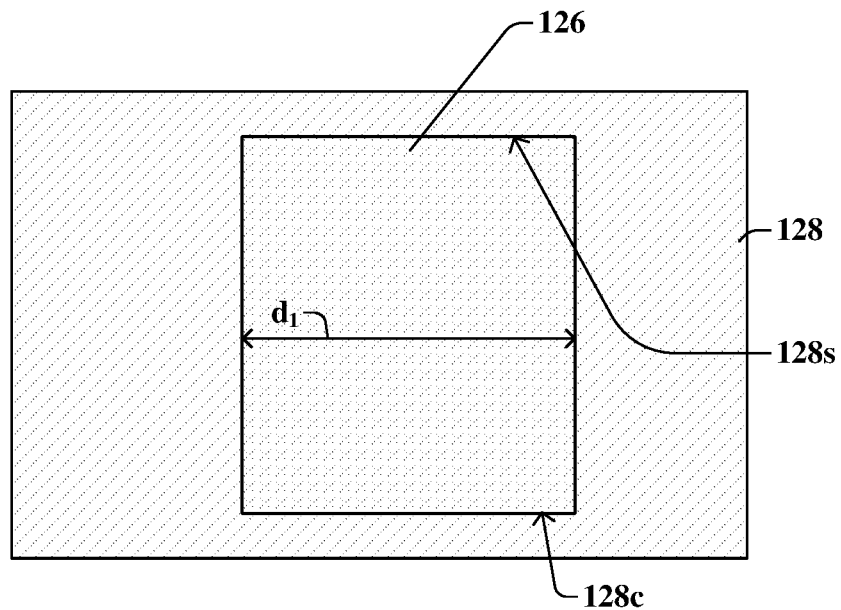

FIG. 9B illustrates a top-view 900B of some embodiments of the substrate 128 after the first removal process (902 of FIG. 9A) in FIG. 9A. As shown in the top-view 900B of FIG. 9B, the trench 128c of the substrate 128 is continuously surrounded by inner sidewalls 128s of the substrate 128.

Figure 10:
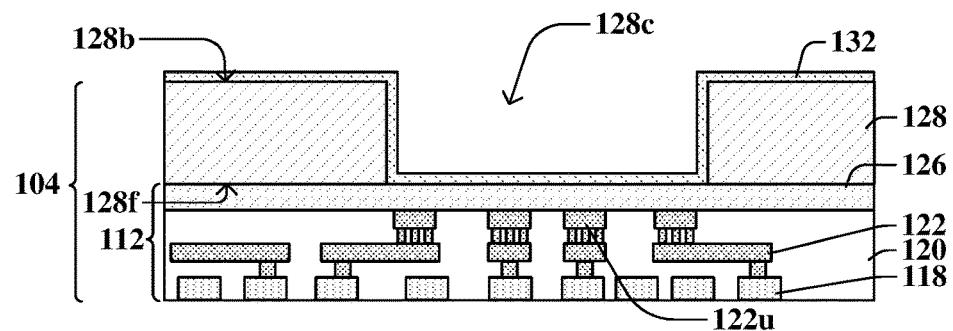

As shown in cross-sectional view 1000 of FIG. 10, in some embodiments, a first insulation layer 132 is formed over the backside 128b of the substrate 128, over the first interconnect dielectric layer 126, and along the sidewalls of the trench 128c of the substrate 128. In some embodiments, the first insulation layer 132 is formed by way of a thermal oxidation process or a deposition process (e.g., PVD, CVD, ALD, etc.). In some embodiments, the first insulation layer 132 comprises an oxide such as silicon dioxide. In some other embodiments, the first insulation layer 132 comprises some other dielectric material such as, for example, a nitride (e.g., silicon nitride, silicon oxynitride), a carbide (e.g., silicon carbide), borosilicate glass (BSG), phosphoric silicate glass (PSG), borophosphosilicate glass (BPSG), a low-k oxide (e.g., a carbon doped oxide, SiCOH), or the like.

Figure 11A:
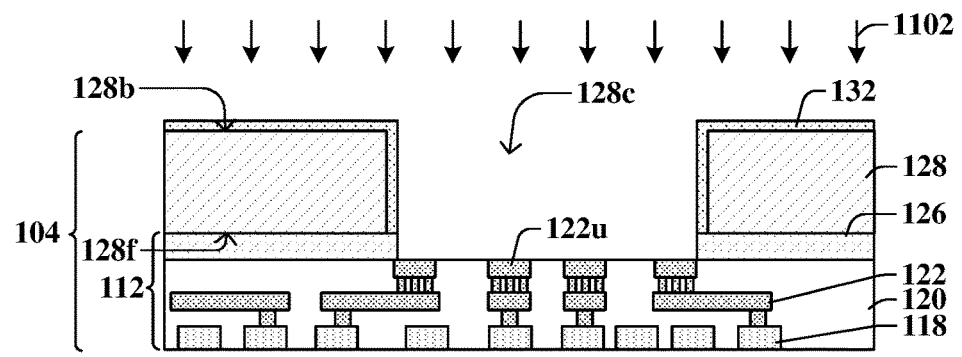
Figure 11B:
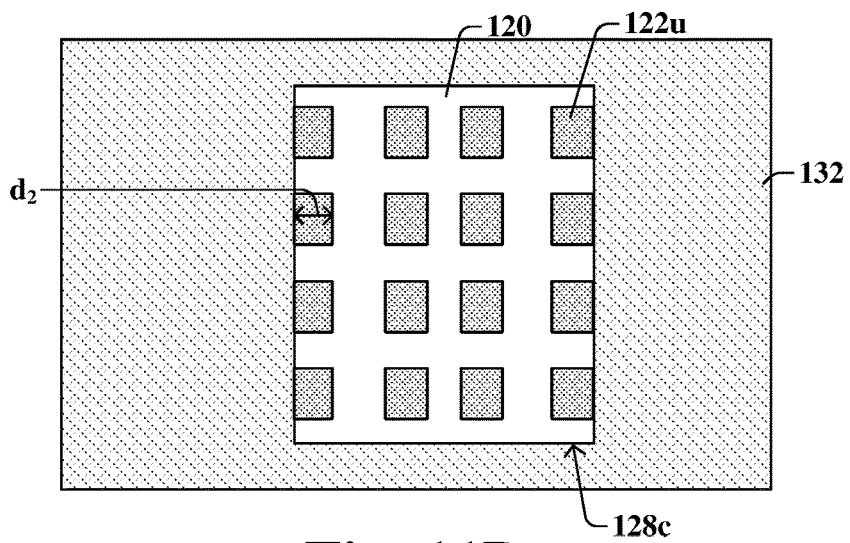
Figure 12:
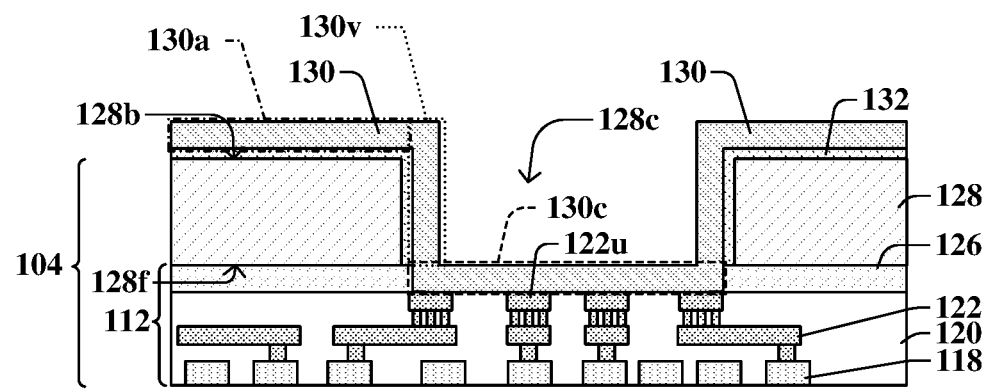

FIGS. 11A, 11B, and 12 illustrate various views 1100A, 1100B, and 1200, respectively, of some embodiments of a method of forming a bond pad structure (130 of FIG. 12), wherein a frontside horizontal portion (130c of FIG. 12) of the bond pad structure 130 is coupled to the upper interconnect conductive structures 122u. Thus, in some embodiments, the method proceeds from FIG. 10 to FIGS. 11A-12.

As shown in cross-sectional view 1100A of FIG. 11A, a second removal process 1102 is performed to remove portions of the first insulation layer 132 and the first interconnect dielectric layer 126 arranged directly over the upper interconnect conductive structures 122u. Thus, after the second removal process 1102, the upper interconnect conductive structures 122u arranged below the trench 128c are exposed. In some embodiments, the second removal process 1102 is a substantially vertical, dry etching process, and a masking structure is not needed. In some other embodiments, a masking structure is used similar to the first masking structure 802 of FIG. 8, wherein the masking structure would not cover the trench 128c of the substrate 128 such that the first insulation layer 132 and the first interconnect dielectric layer 126 are removed according to an opening in the masking structure.

FIG. 11B illustrates a top-view 1100B of some embodiments corresponding to the cross-sectional view 1100A of FIG. 11A after the second removal process 1102. As shown in the top-view 1100B, an array (e.g., more than one) of upper interconnect conductive structures 122u are exposed beneath the trench 128c of the substrate 128, in some embodiments. In some embodiments, the upper interconnect conductive structures 122u have a critical dimension equal to a second distance $d_2$. In some embodiments, the second distance $d_2$ is in a range of between, for example, approximately 0.01 micrometers to approximately 10 micrometers. Because the trench 128c exposes multiple upper interconnect conductive structures 122u, there is a greater tolerance for the exact position of the trench 128c over the multiple upper interconnect conductive structures 122u, which reduces structural and electrical reliability issues of electrical connections in the first IC 104.

As shown in cross-sectional view 1200 of FIG. 12, in some embodiments, a bond pad structure 130 is formed over the backside 128b of the substrate 128, along sidewalls of the trench 128c, and along the upper interconnect conductive structures 122u. In some embodiments, the bond pad structure 130 is formed by a deposition process (e.g., PVD, CVD, ALD, sputtering, etc.). In some embodiments, the bond pad structure 130 comprises a conductive material such as, for example, copper, aluminum, tungsten, or the like. In some embodiments, the bond pad structure 130 has a thickness in a range of between, for example, approximately 0.3 micrometers and approximately 10 micrometers.

In some embodiments, the bond pad structure 130 comprises a backside horizontal portion 130a that extends along the backside 128b of the substrate 128; a vertical portion 130v that extends along the inner sidewalls 128s of the substrate 128; and a frontside horizontal portion 130c that extends along the multiple upper interconnect conductive structures 122u. The vertical portion 130v of the bond pad structure 130 connects the frontside horizontal portion 130c to the backside horizontal portion 130a of the bond pad structure 130. The bond pad structure 130 overall comprises a continuously connected layer that comprises a same material and extends through the substrate 128 to electrically contact the upper interconnect conductive structures 122u. Because of the substantially wide trench 128c, less deposition defects such as voids or underfilling are formed within the bond pad structure than if individual backside through substrate vias extending through the substrate 128 were used to contact each upper interconnect conductive structure 122u.

In some embodiments, after the formation of the bond pad structure 130, a second insulation layer and bond pad structure may be formed over the bond pad structure 130 as will be described in FIGS. 18 and 19. Thus, in some embodiments, the method proceeds from FIG. 12 to FIG. 18, thereby skipping FIGS. 13-17.

Figure 15A:
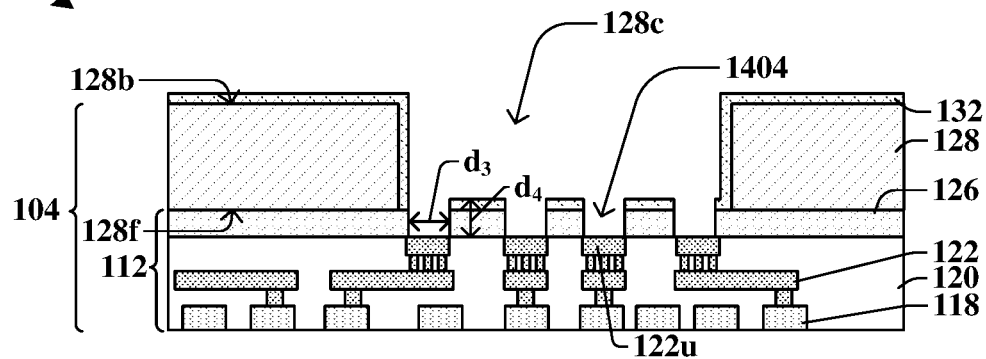
Figure 15B:
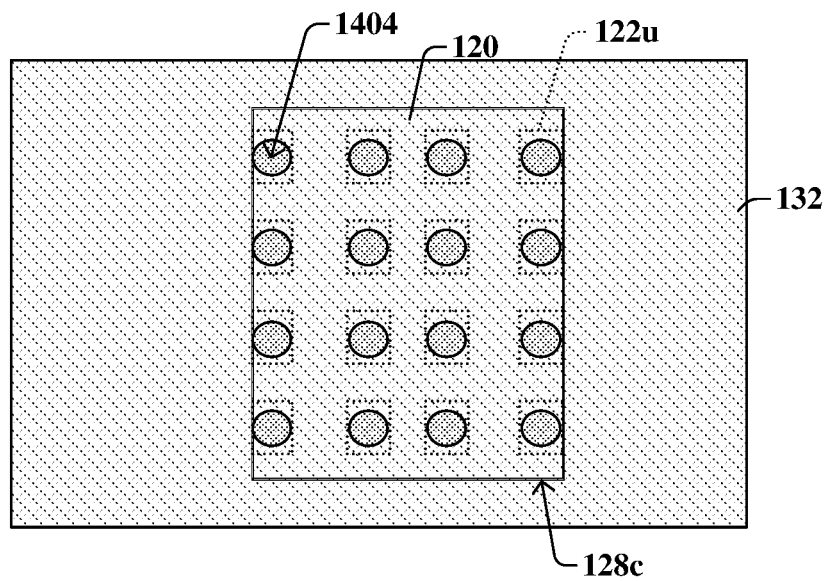
Figure 16:
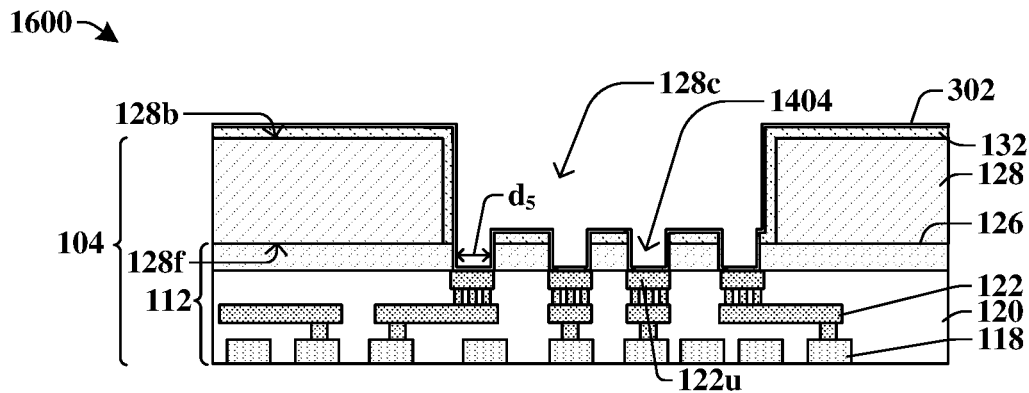
Figure 17:
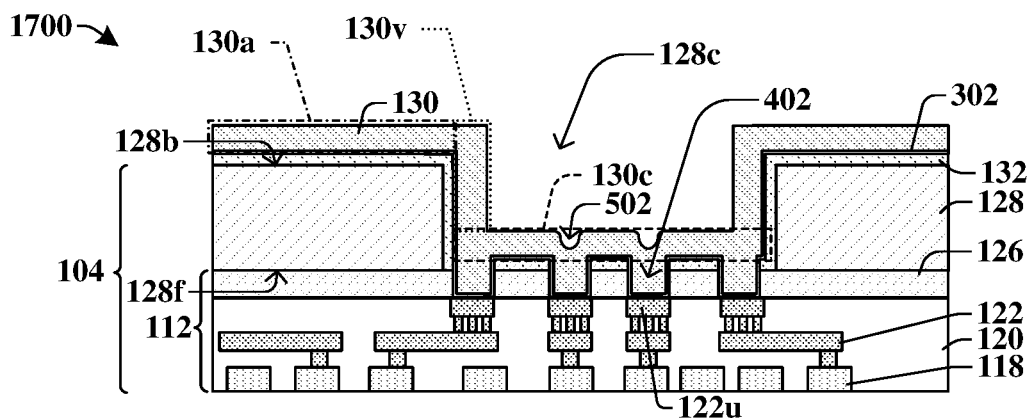

FIGS. 13-17 illustrate various views 1300-1700, respectively, of some other embodiments of a method of forming a bond pad structure (130 of FIG. 17), wherein a frontside horizontal portion (130c of FIG. 17) of the bond pad structure 130 is coupled to the upper interconnect conductive structures 122u through lower protrusion portions (402 of FIG. 17). Thus, in some embodiments, the method proceeds from FIG. 10 to FIG. 13, thereby skipping the steps of FIGS. 11A, 11B, and 12.

Figure 13:
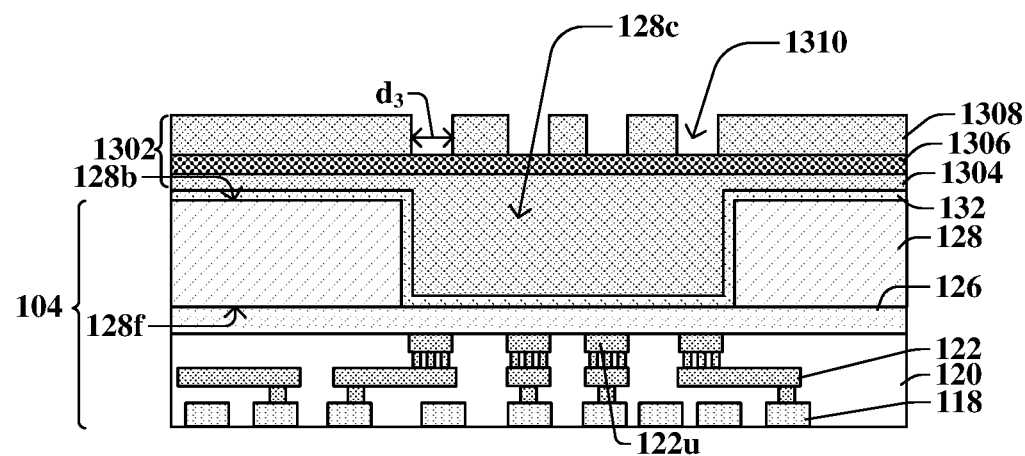

As shown in cross-sectional view 1300 of FIG. 13, in some embodiments, a second masking structure 1302 is formed over the backside 128b of the substrate 128 and within the trench 128c of the substrate 128. In some embodiments, the second masking structure 1302 comprises a first masking layer 1304, a second masking layer 1306 arranged over the first masking layer 1304, and a third masking layer 1308 arranged over the second masking layer 1306. In some embodiments, the second masking structure 1302 comprises multiple layers (e.g., 1304, 1306, 1308) to improve the accuracy of the holes to be formed according to the second masking structure 1302. It will be appreciated that in other embodiments, more or less than three masking layers may be used to form the second masking structure 1302. In some embodiments, the second masking structure 1302 is formed using photolithography and removal (e.g., etching) processes. In some embodiments, the second masking structure 1302 comprises photoresist materials and/or hard mask materials.

In some embodiments, the third masking layer 1308 comprises third holes 1310 that extend completely through the third masking layer 1308 and have a critical dimension equal to a third distance $d_3$. In some embodiments, the third distance $d_3$ is in a range of between, for example, approximately 0.01 micrometers and approximately 1 micrometer. In some embodiments, each third hole 1310 directly overlies at least one upper interconnect conductive structure 122u. In some embodiments, the third holes 1310 are formed by way of photolithography and removal (e.g., etching) processes.

Figure 14:
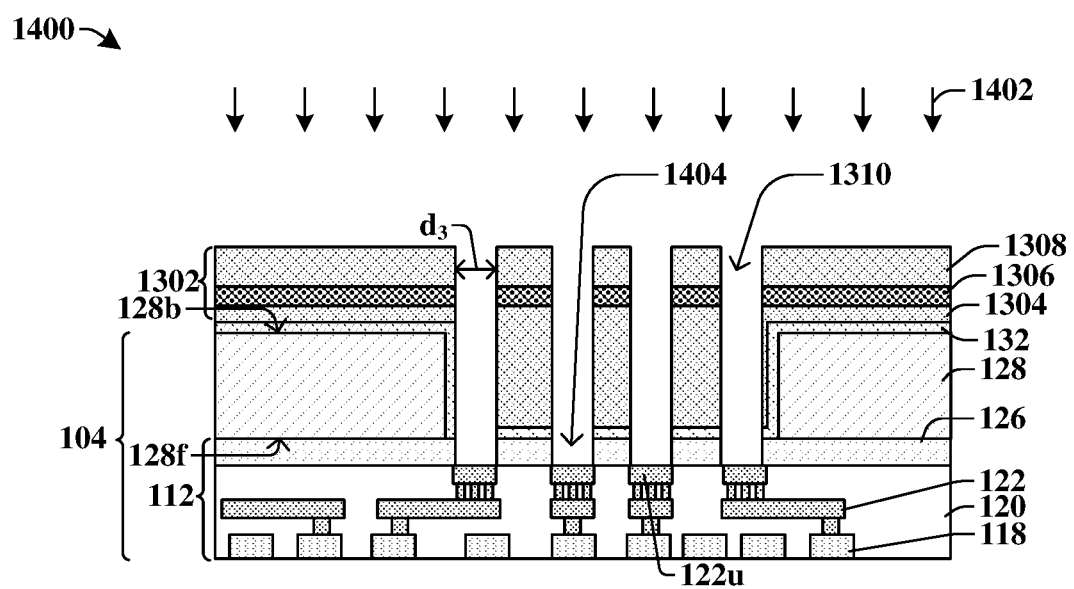

As shown in cross-sectional view 1400 of FIG. 14, a third removal process 1402 is performed according to the third holes 1310 of the second masking structure 1302 to form small trenches 1404 within the first insulation layer 132 and the first interconnect dielectric layer 126 to expose the upper interconnect conductive structures 122u. In some embodiments, the third removal process 1402 comprises one or more dry etching processes. For example, in some embodiments, a different dry etchant is used to remove portions of each layer (e.g., 1306, 1304, 132, 126) arranged between the third holes 1310 of the third masking layer 1308 and the upper interconnect conductive structures 122u. Nevertheless, in some embodiments, after the third removal process 1402, the upper interconnect conductive structures 122u are exposed. In some embodiments, the small trenches 1404 within the first insulation layer 132 and the first interconnect dielectric layer 126 are laterally spaced apart from one another by the first insulation layer 132 and the first interconnect dielectric layer 126.

As shown in cross-sectional view 1500A of FIG. 15A, in some embodiments, the second masking structure 1302 is removed. In some embodiments, the second masking structure 1302 is removed by a wet or dry etching process. The small trenches 1404 are defined by inner sidewalls of the first insulation layer 132 and the first interconnect dielectric layer 126 as well as upper surfaces of the upper interconnect conductive structures 122u. In some embodiments, the small trenches 1404 have a critical dimension or width equal to the third distance $d_3$ and have a height equal to a fourth distance $d_4$. In some embodiments, the fourth distance $d_4$, like the third distance $d_3$, may be in a range of between, for example, approximately 0.01 micrometers and approximately 1 micrometer.

In some embodiments, an aspect ratio of the small trenches 1404 is the ratio of the height (e.g., the fourth distance $d_4$) to the critical dimension (e.g., the third distance $d_3$) of each small trench 1404. In some embodiments, the aspect ratio of the small trenches 1404 after the third removal process (1402 of FIG. 14) is less than or equal to 1. When the aspect ratio is less than or equal to 1, filling the small trenches 1404 with a conductive material to form a bond pad structure (see, FIG. 17) is easier and less likely to comprise defects (e.g., voids, underfill, etc.). If the trench 128c of the substrate 128 were not formed first, then the small trenches 1404 would extend through the entire substrate 128, which would greatly increase the height (fourth distance $d_4$ of the small trenches 1404, thereby increasing the aspect ratio of the small trenches 1404. Such an increase in the aspect ratio of the small trenches 1404 may result in defects in the future bond pad structure to be formed within the small trenches 1404. Thus, the trench 128c of the substrate 128 reduces manufacturing difficulties and overall structural defects of the first IC 104.

FIG. 15B illustrates a top-view 1500B of some embodiments corresponding to the cross-sectional view 1500A of FIG. 15A.

As shown in the top-view 1500B of FIG. 15B, in some embodiments, the small trenches 1404 are formed to have a circular top-view profile, whereas the upper interconnect conductive structures 122u have rectangular top-view profiles. In other embodiments, the top-view profiles of the small trenches 1404 and the upper interconnect conductive structures 122u are different than what is illustrated in FIG. 15B. Further, in some embodiments, each small trench 1404 directly overlies and exposes each upper interconnect conductive structure 122u such that a ratio of small trenches 1404 to upper interconnect conductive structures 122u is equal to one. In some other embodiments, a small trench 1404 may be arranged over and expose more than one upper interconnect conductive structure 122u.

As shown in cross-sectional view 1600 of FIG. 16, in some embodiments a barrier layer 302 is formed over the first insulation layer 132 and along inner sidewalls and bottom surfaces of the small trenches 1404. In some embodiments, the barrier layer 302 comprises a material layer to act as an adhesion layer or a diffusion barrier for materials that will be deposited within the small trenches 1404. In some embodiments, the barrier layer 302 comprises, for example, titanium, tantalum, titanium nitride, tantalum nitride, or some other suitable material. In some embodiments, the barrier layer 302 has a thickness in a range of between, for example, approximately 10 angstroms to approximately 2,000 angstroms. Thus, in some embodiments, critical dimension of the small trenches 1404 reduces from the third distance ($d_3$ of FIG. 15A) to a fifth distance $d_5$ of FIG. 16 when the barrier layer 302 is formed. The difference between the third distance ($d_3$ of FIG. 15A) to a fifth distance $d_5$ of FIG. 16 is two times the thickness of the barrier layer 302. In some embodiments, after the deposition of the barrier layer 302, the aspect ratio of the small trenches 1404 is still less than or equal to 1 such that a material that will fill the small trenches has few defects.

As shown in cross-sectional view 1700 of FIG. 17, a bond pad structure 130 is formed over the backside 128b of the substrate 128, along sidewalls of the trench 128c of the substrate, over the first insulation layer 132 and the first interconnect dielectric layer 126, and within the small trenches (1404 of FIG. 16). In some embodiments, the bond pad structure 130 is formed by a deposition process (e.g., PVD, CVD, ALD, sputtering, etc.). In some embodiments, the bond pad structure 130 comprises a conductive material such as, for example, copper, aluminum, tungsten, or the like. In some embodiments, the bond pad structure 130 has a thickness in a range of between, for example, approximately 0.3 micrometers and approximately 10 micrometers.

In some embodiments, the bond pad structure 130 comprises a backside horizontal portion 130a that extends along the backside 128b of the substrate 128; a vertical portion 130v that extends along the inner sidewalls 128s of the substrate 128; a frontside horizontal portion 130c that extends over the first insulation layer 132 and the first interconnect dielectric layer 126; and lower protrusion portions 402 that fill the small trenches (1404 of FIG. 16) and extend from the frontside horizontal portion 130c to contact each upper interconnect conductive structure 122u. The vertical portion 130v of the bond pad structure 130 connects the frontside horizontal portion 130c to the backside horizontal portion 130a of the bond pad structure 130. In some embodiments, an upper surface of the frontside horizontal portion 130c comprises indents 502 arranged directly over one or more of the upper interconnect conductive structures 122u.

The bond pad structure 130 overall comprises a continuously connected layer that comprises a same material and extends through the substrate 128 to electrically contact the upper interconnect conductive structures 122u. Because of the substantially wide trench 128c and because the aspect ratio of the small trenches (1404 of FIG. 16) is less than 1, voids and other deposition defects that could occur when depositing a material within a small hole are mitigated in the bond pad structure 130, thereby increasing reliability of the first IC 104.

Figure 18:
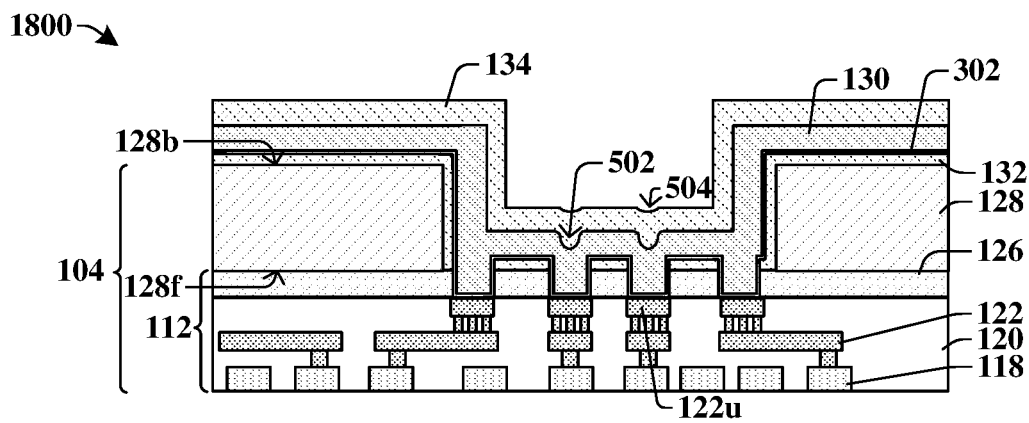

As illustrated in cross-sectional view 1800 of FIG. 18, in some embodiments, a second insulation layer 134 is formed over the bond pad structure 130. In some embodiments, the second insulation layer 134 is formed using a same or similar process as and comprises a same or similar material as the first insulation layer 132. Further, in some embodiments, the second insulation layer 134 may comprise indents 504 arranged directly over indents 502 of the bond pad structure 130.

Figure 19:
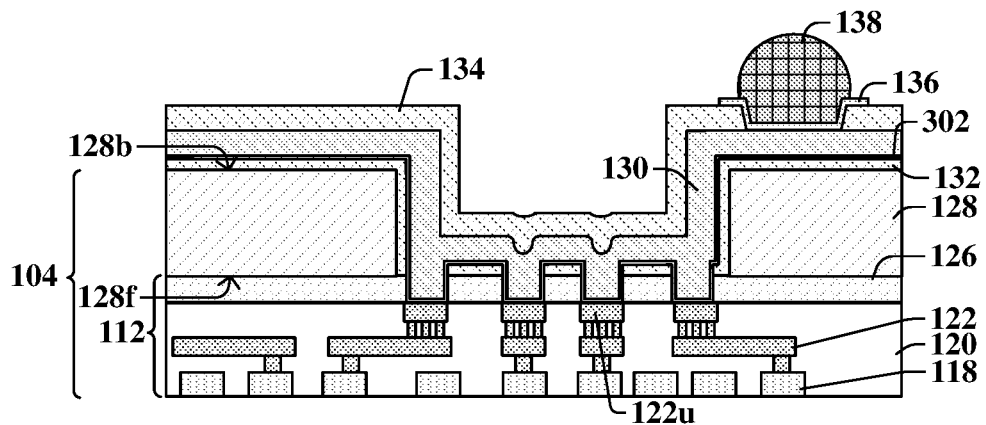

As illustrated in cross-sectional view 1900 of FIG. 19, in some embodiments, an under bump metallization (UBM) layer 136 is formed over the second insulation layer 134 and extends through the second insulation layer 134 to directly contact the bond pad structure 130. In some embodiments, the UBM layer 136 is formed by first removing a portion of the second insulation layer 134 to expose a portion of the bond pad structure 130 by way of photolithography and removal processes followed by a deposition process (e.g., PVD, CVD, ALD, sputtering, etc.) of a conductive material. In some embodiments, the conductive material of the UBM layer 136 comprises, for example, copper, aluminum, titanium, tungsten, tantalum, or some other suitable conductive material. In some embodiments, a bonding structure 138 is formed over the UBM layer 136. In some embodiments, the bonding structure 138 comprises a solder bump, a wire, and/or some other suitable conductive feature. In some embodiments, the bonding structure 138 will be bonded to some other integrated chip, circuit board, or the like in future processing steps. The bond pad structure 130 electrically couples the bonding structure 138 to the interconnect structure 112 of the first IC 104.

Figure 20:
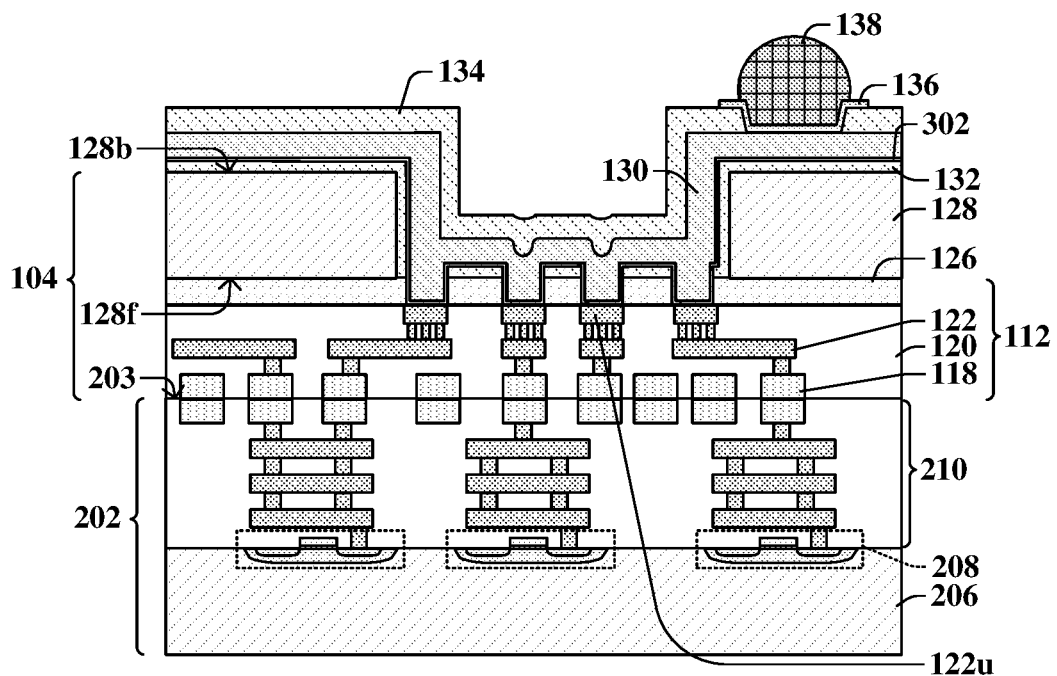

As illustrated in cross-sectional view 2000 of FIG. 20, in some embodiments, the first IC 104 is bonded to a second IC 202 at a bonding interface 203. In some embodiments, the second IC 202 comprises semiconductor devices 208 arranged on and/or within a lower substrate 206. In some embodiments, the second IC 202 further comprises a lower interconnect structure 210 arranged over the lower substrate 206 and electrically coupled to the semiconductor devices 208. In some embodiments, the second IC 202 is bonded to the first IC 104 using bonding contacts 118 of the first IC 104 and bonding contacts 118 of the second IC 202. Thus, in some embodiments, the bonding interface 203 is formed when the using bonding contacts 118 of the first IC 104 and bonding contacts 118 of the second IC 202 are bonded to one another through a bonding process. In some embodiments, the bonding process to bond the first and second ICs 104, 202 to one another may be a fusion bonding process, a eutectic bonding process, a metallic bonding process, and/or a combination thereof (e.g., a hybrid bonding process). It will be appreciated that other bonding structures than the bonding contacts 118 illustrated in FIG. 20 may be used to bond the first IC 104 to the second IC 202.

In some embodiments, through the bonding interface 203, the second IC 202 is electrically coupled to the first IC 104. Further, because of the reliably formed bond pad structure 130, the interconnect structure 112 of the first IC 104 and the lower interconnect structure 210 of the second IC 202 are electrically coupled to the bonding structure 138 arranged on the backside 128b of the substrate 128 of the first IC 104. Therefore, the first and second ICs 104, 202 may be bonded to other ICs through the bonding structure 138 and such other ICs may reliably send signals (e.g., current, voltage) to and from the first and second ICs 104, 202 at least because of the reliably formed bond pad structure 130.

Figure 21:
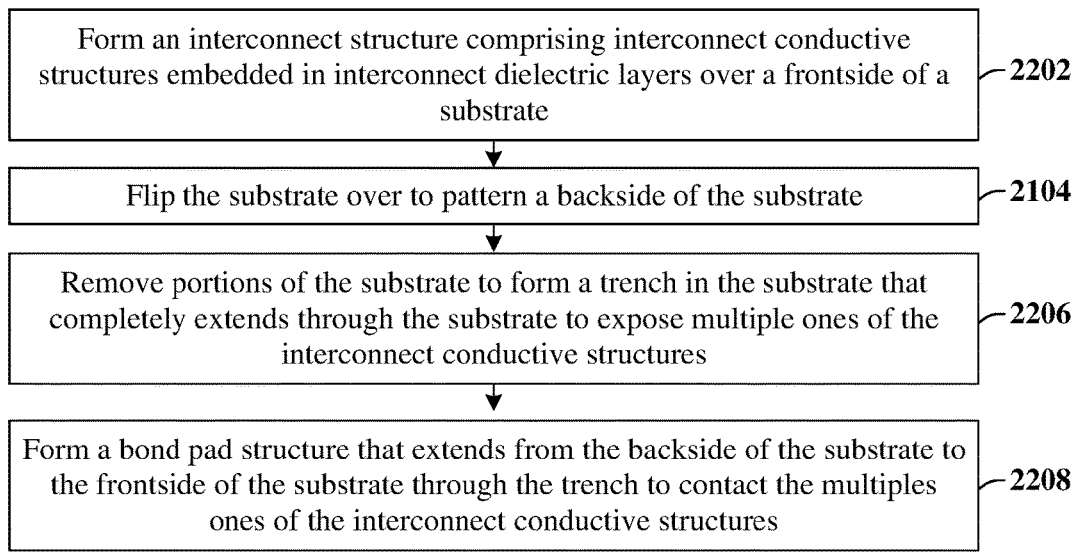
FIG. 21 illustrates a flow diagram of some embodiments of a method corresponding to the method of FIGS. 7-20.

FIG. 21 illustrates a flow diagram of some embodiments of a method 2100 of forming a bond pad structure and corresponding to the method illustrated in FIGS. 7-20.

While method 2100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2102, an interconnect structure is formed that comprises interconnect conductive structures embedded in interconnect dielectric layers over a frontside of a substrate. FIG. 7 illustrates a cross-sectional view 700 of some embodiments corresponding to act 2102.

At act 2104, the substrate is flipped over to pattern a backside of the substrate. FIG. 8 illustrates a cross-sectional view 800 of some embodiments corresponding to act 2104.

At act 2106, portions of the substrate are removed to form a trench in the substrate that completely extends through the substrate to expose multiple ones of the interconnect conductive structures. FIG. 9A illustrates a cross-sectional view 900A of some embodiments corresponding to act 2106.

At act 2108, a bond pad structure is formed that extends from the backside of the substrate to the frontside of the substrate through the trench to contact the multiples ones of the interconnect conductive structures. FIG. 17 illustrates a cross-sectional view 1700 of some embodiments corresponding to act 2108.

Therefore, the present disclosure relates to a method of forming a bond pad structure on a backside of a substrate and extending through a trench of the substrate, wherein the trench overlies multiple interconnect conductive structures such that the bond pad structure may be reliably formed within the trench of the substrate to contact the multiple interconnect conductive structures without using backside through substrate vias (BTSVs).

Accordingly, in some embodiments, the present disclosure relates to a device comprising: a substrate; an interconnect structure arranged on a frontside of the substrate, wherein the interconnect structure comprises interconnect conductive structures embedded within interconnect dielectric layers, wherein the substrate comprises a trench that completely extends through the substrate to expose multiple ones of the interconnect conductive structures; a bond pad structure arranged on a backside of the substrate and extending through the trench of the substrate to contact the multiple ones of the interconnect conductive structures; and a bonding structure arranged on the backside of the substrate and electrically contacting the bond pad structure.

In other embodiments, the present disclosure relates to a device comprising: a substrate; an interconnect structure arranged on a frontside of the substrate and comprising multiple interconnect conductive structures embedded within an interconnect dielectric structure; a bonding structure arranged on a backside of the substrate; and a bond pad structure arranged on the backside of the substrate and extending completely through the substrate to contact the multiple interconnect conductive structures, wherein the bond pad structure comprises: a backside horizontal portion arranged on the backside of the substrate and directly below the bonding structure; a vertical portion arranged on inner sidewalls of the substrate; and a frontside horizontal portion arranged over the multiple interconnect conductive structures.

In yet other embodiments, the present disclosure relates to a method comprising: forming an interconnect structure comprising interconnect conductive structures embedded in interconnect dielectric layers over a frontside of a substrate; flipping the substrate over to pattern a backside of the substrate; removing portions of the substrate to form a trench in the substrate that completely extends through the substrate to expose the interconnect structure, wherein multiple ones of the interconnect conductive structures directly underlie the trench; removing portions of the interconnect dielectric layers to expose the multiple ones of the interconnect conductive structures; and forming a bond pad structure that extends from the backside of the substrate to the frontside of the substrate through the trench of the substrate to contact the multiple ones of the interconnect conductive structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a substrate;
   an interconnect structure arranged on a frontside of the substrate and comprising multiple interconnect conductive structures embedded within an interconnect dielectric structure;
   a bonding structure arranged on a backside of the substrate; a bond pad structure arranged on the backside of the substrate and extending completely through the substrate to contact the multiple interconnect conductive structures, wherein the bond pad structure comprises:
      a backside horizontal portion arranged on the backside of the substrate and directly below the bonding structure;
      a vertical portion arranged on inner sidewalls of the substrate; and
      a frontside horizontal portion arranged over the multiple interconnect conductive structures; and
   a barrier layer arranged directly between the bond pad structure and the multiple interconnect conductive structures.

2. The device of claim 1, wherein the substrate comprises a trench that extends completely through the substrate, wherein the trench is defined by inner sidewalls of the substrate, and wherein the multiple interconnect conductive structures are arranged directly below the trench.

3. The device of claim 1, wherein the frontside horizontal portion of the bond pad structure has a substantially equal thickness throughout its length.

4. The device of claim 1, wherein a bottommost surface of the frontside horizontal portion of the bond pad structure is arranged below a topmost surface of the multiples interconnect conductive structures when the backside of the substrate is arranged over the frontside of the substrate.

5. The device of claim 1, wherein the bond pad structure further comprises:
   lower protrusion portions that extend from the frontside horizontal portion of the bond pad structure and through one or more interconnect dielectric layers of the interconnect dielectric structure, wherein each lower vertical portion is spaced apart from one another in a lateral direction, and wherein each lower protrusion portion directly overlies at least one of the multiple interconnect conductive structures.

6. The device of claim 5, wherein each lower protrusion portion has a width equal to a distance measured between outermost sidewalls of each lower protrusion portion, and wherein each lower protrusion portion has a height equal to a distance measured between a bottommost surface of the frontside horizontal portion and a bottommost surface of each lower protrusion portion, wherein a ratio of the height to the width of each lower protrusion portion is less than or equal to one.

7. The device of claim 5, wherein portions of an upper surface of the frontside horizontal portion of the bond pad structure that are arranged directly over each lower protrusion portion are not substantially planar.

8. The device of claim 1 wherein the frontside horizontal portion has a width larger than a height of the vertical portion.

9. A device comprising:
   a substrate having outer sidewalls and inner sidewalls, and a frontside and backside extending between the outer sidewalls and the inner sidewalls;

an interconnect structure arranged on the frontside of the substrate and comprising multiple interconnect conductive structures embedded within an interconnect dielectric structure;

a bonding structure arranged beneath the backside of the substrate; and a bond pad structure arranged beneath the backside of the substrate and extending completely through the substrate within the inner sidewalls to contact the multiple interconnect conductive structures, wherein the bond pad structure comprises:

a backside horizontal portion arranged on the backside of the substrate and directly below the bonding structure;

a vertical portion arranged on the inner sidewalls of the substrate; and a frontside horizontal portion arranged over the multiple interconnect conductive structures, wherein the backside horizontal portion, the vertical portion, and the frontside horizontal portion are continuously connected to one another and comprise a same conductive material.

10. The device of claim 9, wherein the bonding structure is a solder bump.

11. The device of claim 9, further comprising:
a first insulation layer arranged directly between the substrate and the bond pad structure.

12. The device of claim 11, further comprising:
a second insulation layer arranged between the bond pad structure and the bonding structure, wherein a portion of the bonding structure extends through the second insulation layer to contact the bond pad structure.

13. The device of claim 9, wherein when the backside of the substrate is facing upwards, a bottommost surface of the frontside horizontal portion of the bond pad structure is arranged below the frontside of the substrate.

14. The device of claim 9, wherein the bond pad structure further comprises:
lower protrusion portions that extend from the frontside horizontal portion of the bond pad structure and through the interconnect dielectric structure, wherein each lower vertical portion is spaced apart from one another in a lateral direction by a dielectric layer of the interconnect dielectric structure, and wherein each lower protrusion portion directly overlies and contacts at least one interconnect conductive structure.

15. The device of claim 9 wherein a portion of the bond pad structure is above the frontside of the substrate.

16. The device of claim 9 wherein the frontside horizontal portion has a width larger than a height of the vertical portion.

17. A device comprising:
a monocrystalline silicon substrate having outer sidewalls and inner sidewalls;

an interconnect structure arranged on a first side of the monocrystalline silicon substrate and comprising multiple interconnect conductive structures embedded within an interconnect dielectric structure;

a bonding structure arranged on a second side of the monocrystalline silicon substrate, the second side opposite the first side; and a bond pad structure arranged on the second side of the monocrystalline silicon substrate and extending completely through the monocrystalline silicon substrate within the inner sidewalls to contact the multiple interconnect conductive structures, wherein the bond pad structure comprises:

a backside horizontal portion arranged on the second side of the monocrystalline silicon substrate and directly below the bonding structure;

a vertical portion arranged along the inner sidewalls of the monocrystalline silicon substrate;

a first side horizontal portion arranged over the multiple interconnect conductive structures and over the first side of the monocrystalline silicon substrate; and a second horizontal portion arranged on the second side of the monocrystalline silicon substrate.

18. The device of claim 17, wherein when the second side of the monocrystalline silicon substrate is facing upwards, a bottommost surface of the first side horizontal portion of the bond pad structure is arranged below the first side of the monocrystalline silicon substrate.

19. The device of claim 18, wherein the first side horizontal portion, the vertical portion, and the second horizontal portion are continuously connected to one another and comprise a same conductive material.

20. The device of claim 17 wherein a portion of the bond pad structure is above a frontside of the monocrystalline silicon substrate.

* * * * *